United States Patent [19]

Meyer

[11] Patent Number: 5,049,764

[45] Date of Patent: Sep. 17, 1991

[54] ACTIVE BYPASS FOR INHIBITING HIGH-FREQUENCY SUPPLY VOLTAGE VARIATIONS IN INTEGRATED CIRCUITS

[75] Inventor: Robert G. Meyer, Berkeley, Calif.

[73] Assignee: North American Philips Corporation, Signetics Div., Sunnyvale, Calif.

[21] Appl. No.: 469,903

[22] Filed: Jan. 25, 1990

[51] Int. Cl.$^5$ ............... H03K 17/16; H03K 17/60; H03K 19/003; H03K 17/14

[52] U.S. Cl. .................... 307/443; 307/542; 307/520; 307/491; 307/263; 361/56; 361/91; 361/111

[58] Field of Search ............ 307/520, 443, 491, 540, 307/542, 590, 591, 592, 296.1, 263, 296.6, 454, 475; 361/56, 91, 58, 111; 365/8

[56] References Cited

U.S. PATENT DOCUMENTS

| | | | |
|---|---|---|---|
| 3,619,659 | 11/1971 | Meyer | 307/263 |
| 4,439,802 | 3/1984 | Johansson | 361/56 |
| 4,686,383 | 8/1987 | Croft | 361/56 X |
| 4,740,717 | 4/1988 | Fletcher et al. | 307/443 |
| 4,893,212 | 1/1990 | Wong et al. | 361/91 |
| 4,894,567 | 1/1990 | Lenk | 307/542 |
| 4,924,339 | 5/1990 | Atsumi et al. | 361/56 |
| 4,939,616 | 7/1990 | Rountree | 361/56 |
| 4,947,063 | 8/1990 | O'Shaughnessy et al. | 307/542 X |
| 4,952,822 | 8/1990 | Dikken | 307/542 X |

FOREIGN PATENT DOCUMENTS

| | | |
|---|---|---|
| 0029134 | 8/1983 | European Pat. Off. . |
| 0709376 | 7/1941 | Fed. Rep. of Germany . |
| 2946305 | 5/1981 | Fed. Rep. of Germany . |

OTHER PUBLICATIONS

Widlar, "Some Circuit Design Techniques for Linear Integrated Circuit", IEEE Transactions on Circuit Theory; pp. 586–590, vol. CT-12, No. 4, Dec. 1985.

Primary Examiner—Stanley D. Miller
Assistant Examiner—David R. Bertelson
Attorney, Agent, or Firm—A. Tamoshunas; J. Haken; R. Meetin

[57] ABSTRACT

An integrated circuit (10, 22) contains an active bypass (36) that inhibits high-frequency supply-voltage variations caused by interaction of the circuitry elements (28) with the parasitic inductances ($L_{HE}$, $L_{HP}$, $L_{LP}$, and $L_{LE}$) associated with the power supply lines ($16_H/24_H/26_H/32_H$ and $16_L/24_L/26_L/32_L$) for the circuit. The bypass centers around a transistor ($Q_{BP}$) coupled between the supply lines. An activation circuit (38) provides the transistor with a control signal ($V_C$) to activate the transistor. A sensing capacitor ($C_S$) provides a capacitive action between the transistor control electrode and one of the supply lines.

18 Claims, 3 Drawing Sheets

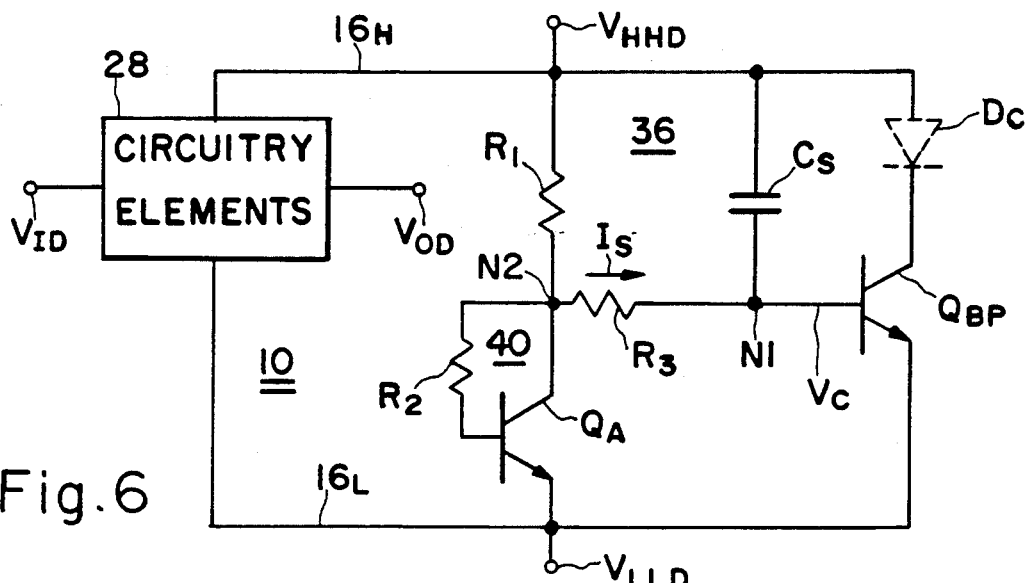
Fig. 6
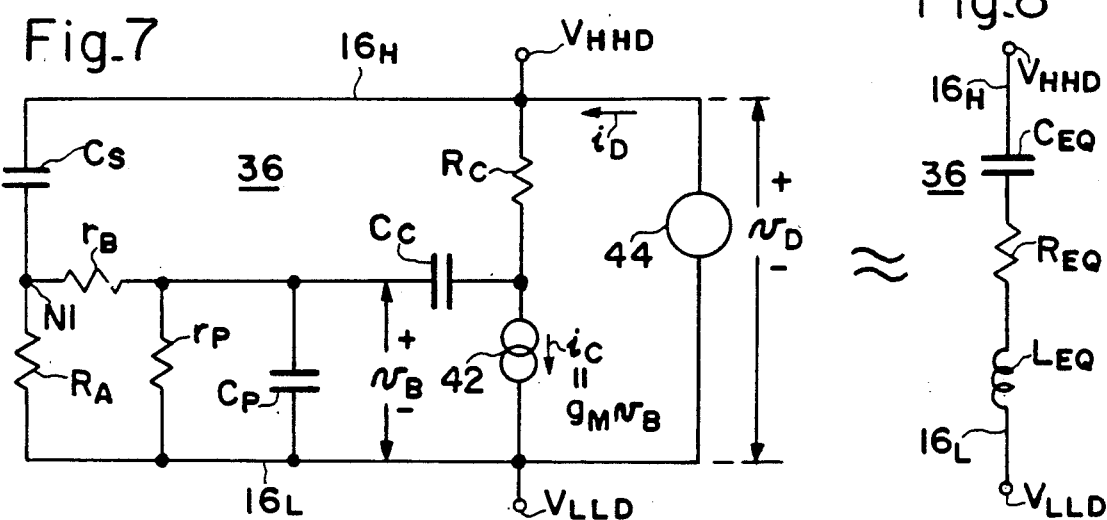
Fig. 7
Fig. 8
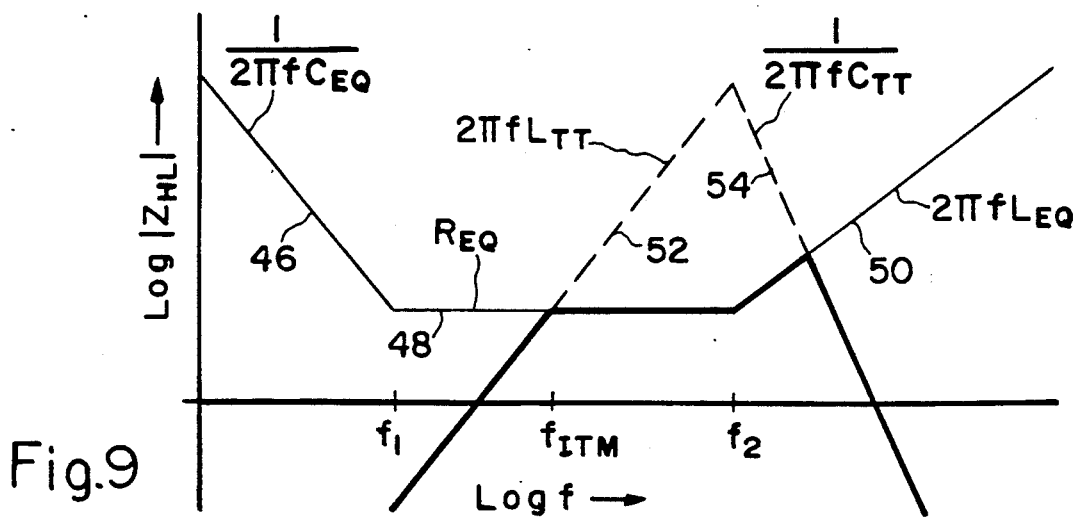
Fig. 9

ACTIVE BYPASS FOR INHIBITING HIGH-FREQUENCY SUPPLY VOLTAGE VARIATIONS IN INTEGRATED CIRCUITS

FIELD OF USE

This invention relates to semiconductor integrated circuits ("ICs") and, more particularly, to circuitry that inhibits high-frequency ("HF") variations in the internal supply voltages of an IC.

BACKGROUND ART

As advancements have enabled ICs to perform circuit operations at greater and greater speeds, ICs have become more sensitive to the inductances of the bond wires, IC package leads, and external supply lines that provide operating power. The effects of these parasitic inductances must be suitably controlled in order to avoid undesired modes of circuit operation.

An understanding of the way in which these inductances affect circuit performance is facilitated with the assistance of FIG. 1 which illustrates a cross-section of a typical dual-in-line packaged IC. The central portion of this packaged IC is a semiconductor die 10 consisting of a generally flat monocrystalline silicon semiconductive body 12 and an adjoining electrical interconnection system 14. Semiconductive body 12 is divided into various P-type and N-type semiconductive regions (not shown). Interconnection system 14 is divided into various electrically conductive and electrically insulating regions of which FIG. 1 only depicts internal power supply lines $16_L$ and $16_H$. The semiconductive regions in body 12 together with the electrical interconnections provided by system 14 define a group of electronic circuitry elements. Lines $16_L$ and $16_H$ (usually consisting principally of a metal such as aluminum) transmit internal supply voltages that provide power to operate the circuitry elements.

Die 10 is mounted on a metal leadframe 18 along a thin electrically insulating layer 20 formed along the bottom of body 12. An electrically insulating package 22 (typically fabricated with a thermosetting resin or a ceramic material) substantially surrounds die 10 (and leadframe 18) to protect die 10. A set of metallic electrical conductors extend through package 22 to contact bond pads in interconnection system 14. Each of these conductors consists of an externally protruding electrical lead and a bond wire that extends between the lead and the associated bond pad. As indicated in FIG. 1, bond wires $24_L$ and $24_H$ thus respectively connect externally accessible supply leads $26_L$ and $26_H$ with supply lines $16_L$ and $16_H$.

FIG. 2 is a circuit diagram which generally illustrates the major inductances that affect the operation of the IC in FIG. 1. Dashed lines 10 and 22 in FIG. 2 respectively represent the physical extents of die 10 and package 22 in FIG. 1. Leads $26_L$ and $26_H$ are represented as pins (or terminals) in FIG. 2. The circuitry elements in die 10 are generally denoted by block 28 that L receives internal high and low supply voltages $V_{HHD}$ and $V_{LLD}$ along respective lines $16_H$ and $16_L$. Item $L_{HP}$ is the parasitic inductance associated with wire $24_H$ and lead $26_H$. Similarly, item $L_{LP}$ is the parasitic inductance associated with wire $24_L$ and lead $26_L$. (The parasitic inductances associated with lines $16_H$ and $16_L$ are much smaller than those associated with composite conductors $24_H/26_H$ and $24_L/26_L$ and, for the purpose of the model shown in FIG. 2, can simply be considered parts of inductances $L_{HP}$ and $L_{LP}$.)

A battery 30 provides substantially constant external high and low supply voltages $V_{HHE}$ and $V_{LLE}$ on respective external lines $32_H$ and $32_L$ that respectively connect to leads $26_H$ and $26_L$. External supply voltages $V_{HHE}$ and $V_{LLE}$ (whose difference is the overall power supply voltage) are substantially the steady-state values for internal supply voltages $V_{HHD}$ and $V_{LLD}$. $V_{LLE}$ is typically ground reference (0 volt). Items $L_{HE}$ and $L_{LE}$ are the parasitic inductances respectively associated with external supply lines $32_H$ and $32_L$. Normally, line $32_L$ consists of a large highly conductive ground plane so that $L_{LE}$ is very small compared to $L_{HE}$.

Responsive to a die input signal $V_{ID}$, circuitry elements 28 provide a die output signal $V_{OD}$. Die input signal $V_{ID}$ is supplied on an internal die line which connects to a package conductor having a lead (or pin) $34_I$ that receives an external input signal $V_{IE}$. Die output signal $V_{OD}$ is similarly provided on an internal die line which connects to a package conductor having a lead (or pin) $34_O$ that supplies an external output signal $V_{OE}$. Items $L_{IP}$ and $L_{OP}$ are the parasitic inductances respectively associated with these two package conductors (plus the small parasitic inductances respectively associated with the connecting die lines).

The voltage across an inductor (or inductance) is the inductance value multiplied by the rate of change of current flowing through the inductor. When external input $V_{IE}$ changes in such a way that circuitry elements 28 cause external output $V_{OE}$ to change, the $V_{OE}$ change often causes the currents through composite supply lines $16_H/24_H/26_H/32_H$ and $16_L/24_L/26_L/32_L$ to change in a rapid oscillatory manner. The resulting voltages across inductances $L_{HE}$, $L_{HP}$, $L_{LP}$, and $L_{LE}$ typically produce transient HF variations, conventionally referred to as "ringing", in internal supply voltages $V_{HHD}$ and $V_{LLD}$. For example, see U.S. Pat. No. 4,740,717. In turn, the supply line ringing sometimes causes output $V_{OE}$ to be produced at an undesired value.

When circuitry elements 28 include an HF amplifier, an even greater problem can occur if the supply line ringing penetrates back to the amplifier input line. As a result of the undesired (parasitic) feedback loop that is so formed, the ringing can cause the amplifier to undergo sustained oscillations. This renders the entire IC inoperative.

One approach that has been taken in the prior art to reduce the ringing in voltages $V_{HHD}$ and $V_{LLD}$ is to connect an external capacitor between supply leads $26_H$ and $26_L$. These connections create a passive bypass that can substantially decrease the portion of the supply line ringing due to external inductances $L_{HE}$ and $L_{LE}$. However, this approach does not significantly reduce the portion of the ringing caused by internal inductances $L_{HP}$ and $L_{LP}$.

A more complete technique used in the prior art to inhibit supply line ringing is to provide an on-chip bypass capacitor between internal supply lines $16_H$ and $16_L$. FIG. 3 illustrates this technique in which item $C_{BP}$ is the bypass capacitor. At high frequency, capacitor $C_{BP}$ effectively short circuits lines $16_H$ and $16_L$ so as to reduce the $V_{HHD}$ and $V_{LLD}$ ringing that would otherwise result from internal inductances $L_{HP}$ and $L_{LP}$ as well as external inductances $L_{HE}$ and $L_{LE}$. Unfortunately, capacitor $C_{BP}$ must be very large to be effective. It sometimes occupies more chip area than all the rest of circuitry elements 28 together. This is extremely undesirable where, as is generally the case, minimization of die area is important.

Making capacitor $C_{BP}$ small creates a significant risk that it will form a parallel resonance with inductances $L_{HE}$, $L_{HP}$, $L_{LP}$, and $L_{LE}$. The supply line impedance at the resonant frequency becomes very high and leads to a much enhanced likelihood of circuit oscillations.

GENERAL DISCLOSURE OF THE INVENTION

The present invention is a semiconductor integrated circuit that contains on-chip bypass circuitry which inhibits transient HF supply-voltage variations that would otherwise occur as the result of both internal and external inductances associated with the voltage supply lines for the IC. In contrast to the prior art passive bypass techniques described above, the bypass circuitry in the invention functions in an active manner. The active bypass consumes a relatively small bias current and typically occupies a very small portion of the chip area.

More particularly, the present IC contains a group of electronic circuitry elements formed in a semiconductor die comprising a monocrystalline semiconductive body and an electrical interconnection system that adjoins the semiconductive body. The interconnection system includes first and second internal power supply lines that transmit first and second internal supply voltages to provide operating power for the circuitry elements.

The active bypass, which is formed as part of the die, centers around a bypass transistor having a first flow electrode coupled to the first supply line, a second flow electrode coupled to the second supply line, and a control electrode for controlling current flow between the flow electrodes. The conductivity of the transistor depends substantially on the voltage difference between the control electrode and the first electrode. An activation circuit provides the control electrode with a control signal to activate the transistor. A sensing capacitor provides a capacitive action between the second supply line and the control electrode.

When a rapid change in the second internal supply voltage starts to occur as the result of supply line inductance, the capacitor transmits the incipient change to the control electrode. The current flowing through the transistor then increases or decreases in such a manner as to inhibit the second supply voltage from changing. For example, if the second supply voltage starts to increase, the transistor becomes more conductive. This causes the second supply voltage to decrease. A similar effect occurs when the first internal supply voltage starts to change.

In a preferred embodiment, the transistor is a bipolar device having an emitter, a collector, and a base which are respectively the first, second, and control electrodes. The activation circuit is a current source coupled between the base and the second supply line. The capacitor is connected directly between the base and the second supply line.

At high frequency, the AC impedance presented to the supply lines by the preceding embodiment of the invention is small and significantly resistive. Supply line ringing is thereby greatly attenuated. In addition, resonance/circuit oscillation problems of the type described above are avoided.

BRIEF DESCRIPTION OF THE DRAWINGS

FIGS. 7 and 8 are circuit diagrams of small-signal AC equivalents of the active bypass in FIG. 6.

FIG. 9 is a graph for the AC impedance characteristics of the die circuitry in FIG. 6.

Like reference symbols are employed in the drawings and in the description of the preferred embodiments to represent the same or very similar item or items.

DESCRIPTION OF THE PREFERRED EMBODIMENTS

Figure 1:
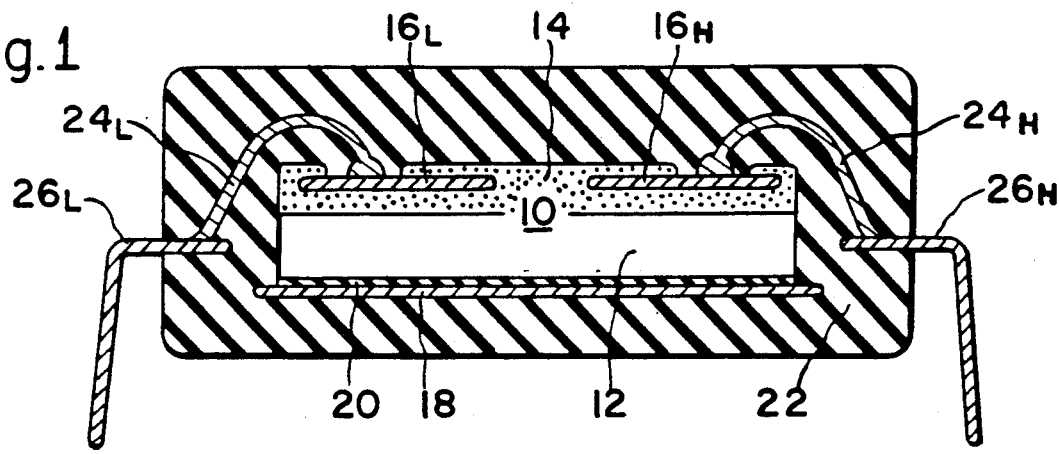
FIG. 1 is a cross-sectional structural end view of a typical dual-in-line packaged IC.
Figure 4:
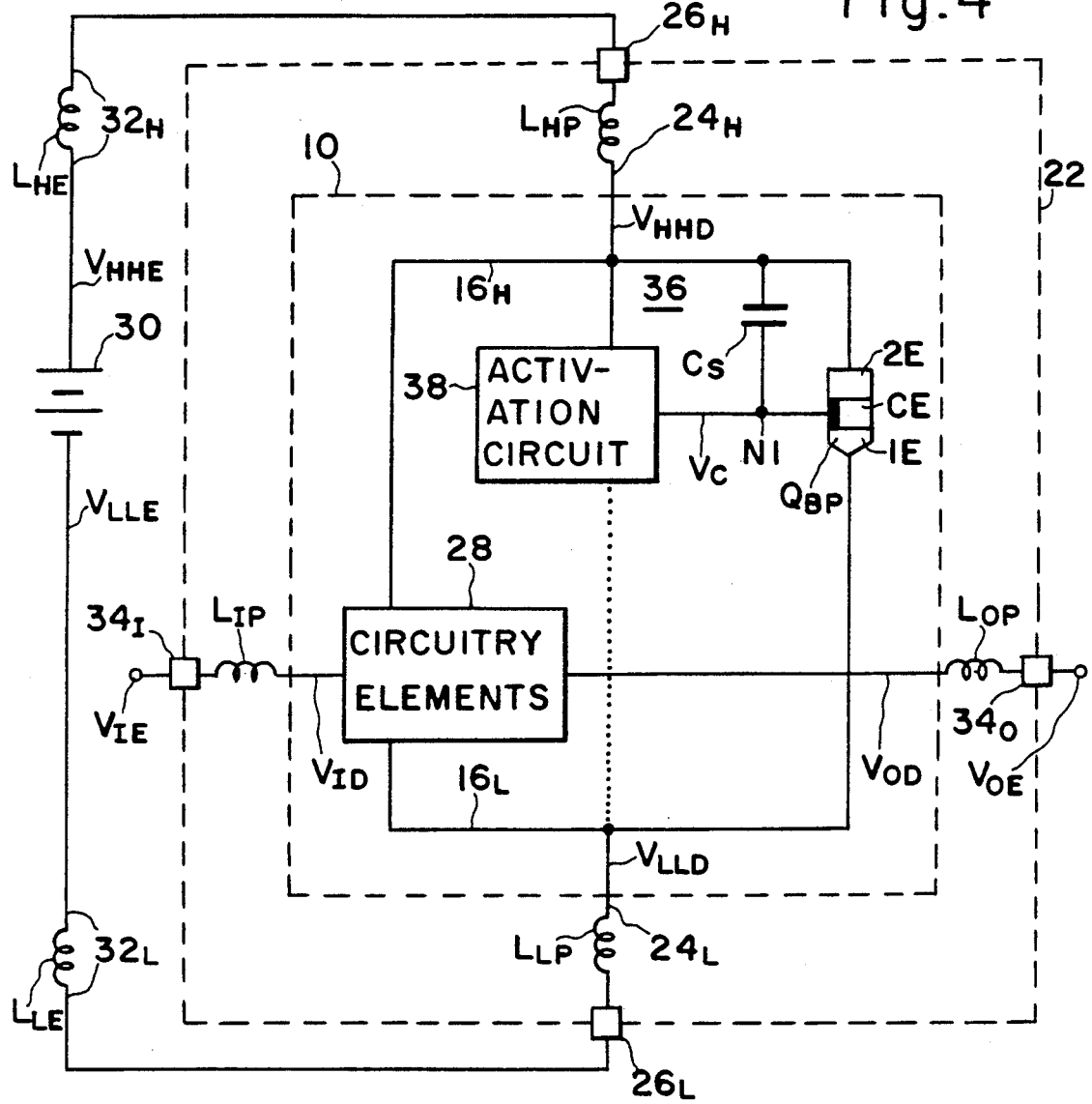
FIG. 4 is a circuit diagram of a packaged IC and the associated off-chip power supply circuitry, where the IC contains an active bypass for inhibiting internal supply line voltage variations.

FIG. 4 is a circuit diagram illustrating how various supply line inductances interact with a packaged IC arranged according to the teachings of the invention. This IC consists of die 10 and surrounding package 22 physically configured in a conventional manner such as that shown in FIG. 1. That is, die 10 consists of monocrystalline silicon semiconductive body 12 and adjoining interconnection system 14 having internal power supply lines $16_H$ and $16_L$ that transmit internal power supply voltages $V_{HHD}$ and $V_{LLD}$. Bond wires $24_H$ and $24_L$ again respectively connect lines $16_H$ and $16_L$ with externally protruding leads $26_H$ and $26_L$ that are shown as pins in FIG. 4. Items $L_{HP}$ and $L_{LP}$ are basically the inductances respectively associated with package conductors $24_H/26_H$ and $24_L/26_L$.

Figure 2:
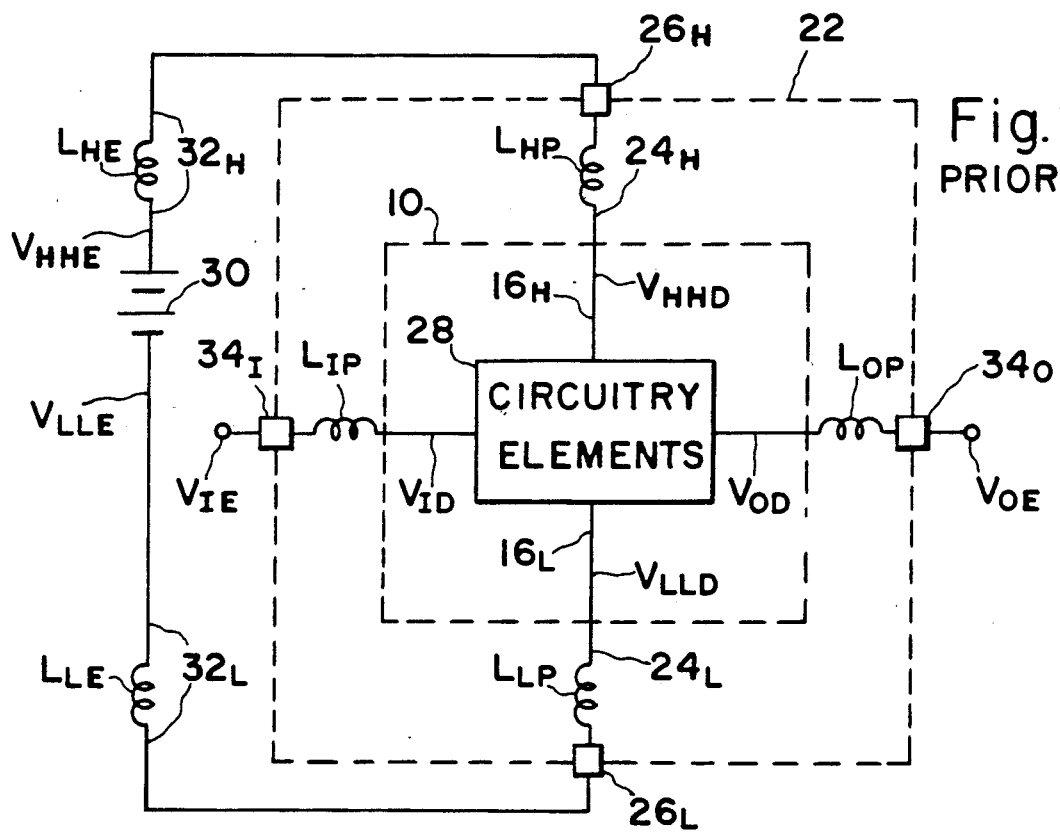
FIG. 2 is a circuit diagram of a prior art packaged IC and the associated off-chip power supply circuitry.
Figure 3:
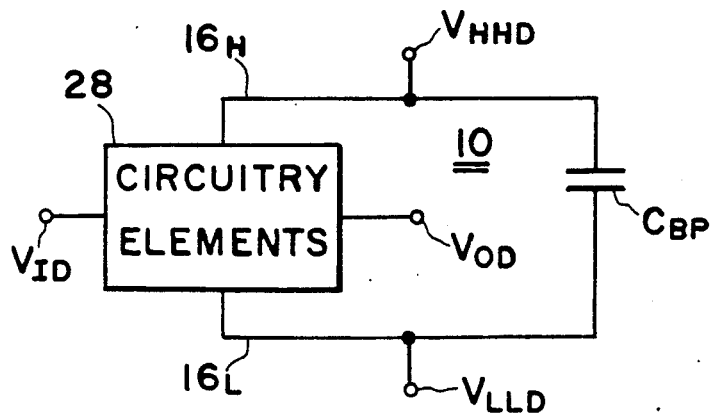
FIG. 3 is a circuit diagram of a prior art IC die containing an on-chip bypass capacitor.

As in FIG. 2, lines $16_H$ and $16_L$ provide operating power for circuitry elements 28 which produce die output signal $V_{OD}$ in response to die input signal $V_{ID}$. Leads $34_I$ and $34_O$ and inductances $L_{IP}$ and $L_{OP}$ have the same meaning in FIG. 4 as described above for FIG. 2. Likewise, battery 30, external supply lines $32_H$ and $32_L$, external supply voltages $V_{HHE}$ and $V_{LLE}$, inductances $L_{HE}$ and $L_{LE}$, external input signal $V_{IE}$, and external output signal $V_{OE}$ all have the same meaning in FIG. 4 as in FIG. 2. $V_{LLE}$ is preferably ground reference.

In accordance with the invention, die 10 of the present IC contains an active bypass 36 that inhibits ringing in internal supply voltages $V_{HHD}$ and $V_{LLD}$ due to the interaction of circuitry elements 28 with inductances $L_{HE}$, $L_{HP}$, $L_{LP}$, and $L_{LE}$ when a change in external input $V_{IE}$ causes external output $V_{OE}$ to change. Bypass 36 consists of a bypass transistor $Q_{BP}$, a sensing capacitor $C_S$, and an activation (or bias) circuit 38. Bypass transistor $Q_{BP}$ has a first flow electrode 1E connected to low supply line $16_L$, a second flow electrode 2E connected to high supply line $16_H$, and a control electrode that controls current flow between flow electrodes 1E and 2E. Sensing capacitor $C_S$ is connected between high supply line $16_H$ and control electrode CE by way of a node N1. Activation circuit 38, which is at least connected between lines $16_H$ and electrode CE and may also be connected to lines $16_L$, provides electrode CE with a control voltage $V_C$ in order to activate (or bias) transistor $Q_{BP}$.

Bypass 36 acts essentially as follows. Circuitry 38 maintains transistor $Q_{BP}$ in a conductive condition. The conductivity of transistor $Q_{BP}$—i.e., the amount of current flowing between electrodes 1E and 2E—depends on the voltage difference between electrodes CE and 1E. Charge carriers (normally electrons for the voltage polarities shown in FIG. 4, but normally holes if the voltage polarities are reversed) that move between electrodes 1E and 2E substantially originate at electrode 1E and terminate at electrode 2E. Consequently, electrode 1E is a current-supplying element, whereas electrode 2E is a current-receiving element.

Assume that $V_{LLD}$ is constant. When a change in the current flowing through inductances $L_{HE}$ and $L_{HP}$ causes $V_{HHD}$ to move slightly away from $V_{HHE}$, capacitor $C_S$ senses the change. If $V_{HHD}$ is increasing, capacitor $C_S$ pulls $V_C$ upward to make transistor $Q_{BP}$ more conductive. The increased current flow through transistor $Q_{BP}$ pulls $V_{HHD}$ back down. Similarly, if $V_{HHD}$ is starting to decrease, capacitor $C_S$ forces $V_C$ downward to reduce the conductivity of transistor $Q_{BP}$. The decreased current flowing through transistor $Q_{BP}$ causes voltage $V_{HHD}$ to move back towards $V_{HHE}$.

Next, assume that $V_{HHD}$ is constant. When a change in the current flowing through inductances $L_{LP}$ and $L_{LE}$ causes $V_{LLD}$ to vary slightly from $V_{LLE}$, capacitor $C_{BP}$ temporarily maintains the voltage between electrodes 2E and CE at a (substantially) constant value. Consequently, the voltage difference between electrodes CE and 1E starts to change. If $V_{LLD}$ decreases, the voltage difference between electrodes CE and 1E increases so as to make transistor $Q_{BP}$ more conductive. The increased current flow through transistor $Q_{BP}$ pulls $V_{LLD}$ back up. Likewise, if $V_{LLD}$ increases, the voltage difference between electrodes CE and 1E decreases. This makes transistor $Q_{BP}$ less conductive. The decreased current flow through transistor $Q_{BP}$ forces $V_{LLD}$ back toward $V_{LLE}$.

If both $V_{HHD}$ and $V_{LLD}$ are starting to change, the operational effects described in the two preceding paragraphs are superimposed on each other so as to cause $V_{HHD}$ and $V_{LLD}$ to stay respectively very close to $V_{HHE}$ and $V_{LLE}$. In this way, circuitry 36 provides lines $36_H$ and $36_L$ with a current bypass that reduces supply line ringing which would otherwise result from both external inductances $L_{HE}$ and $L_{LE}$ and internal inductances $L_{HP}$ and $L_{LP}$. The likelihood of undesired sustained oscillations in circuitry elements 28 is likewise decreased.

Transistor $Q_{BP}$ is preferably a bipolar transistor having an emitter, a collector, and a base which are respectively electrodes 1E, 2E, and CE. However, transistor $Q_{BP}$ might be a field-effect transistor (FET) of either the insulated-gate or junction type. The source, drain, and gate electrode of the FET are respectively electrodes 1E, 2E, and CE.

Figure 5:
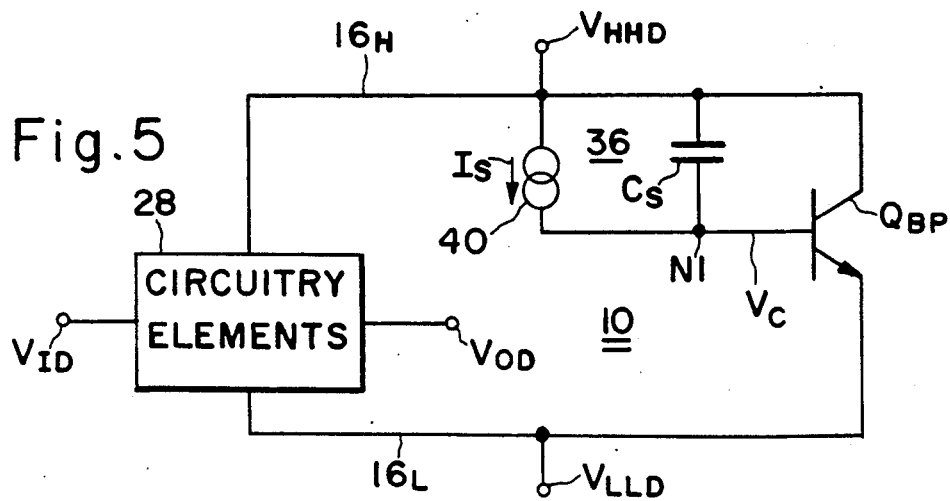
FIGS. 5 an 6 are circuit diagrams of ICs that utilize bipolar implementations of the active bypass in FIG. 4.

Turning to FIG. 5, we see an implementation of die 10 in which bypass 36 is implemented in bipolar form. Transistor $Q_{BP}$ is an NPN transistor. Activation circuit 38 of FIG. 4 is a current source 40 in FIG. 5. Current source 40 provides transistor $Q_{BP}$ with a supply current $I_S$.

FIG. 6 shows a preferred embodiment of die 10 in FIG. 5 for which the bipolar components of bypass 36 are shown in more detail. Current source 40 in FIG. 6 consists of NPN transistor QA and resistors $R_1$, $R_2$, and $R_3$. The QA emitter is connected to line $16_L$. The QA collector is coupled by way of a node N2 (1) through resistor $R_1$ to line $16_H$, (2), through resistor $R_2$ to the $Q_A$ base, and (3) through resistor $R_3$ to the $Q_{BP}$ base. Current source 40 operates in a conventional manner as, for example, briefly discussed in Widlar, "Some Circuit Design Techniques for Linear Integrated Circuits," IEEE Trans. Cir. Theory, Dec. 1965, pp. 58614 590.

One or more diodes may be connected in series between the $Q_{BP}$ collector and line $16_H$ in order to reduce the $Q_{BP}$ collector-emitter voltage. Since transistor $Q_{BP}$ is subjected to the full power supply voltage $V_{HHE}-V_{LLE}$, this helps to alleviate voltage breakdown problems. FIG. 6 shows, for example, a single such collector diode $D_C$.

FIG. 7 depicts a small-signal AC equivalent of active bypass 36 in FIG. 6. Transistor $Q_{BP}$ is represented in FIG. 7 by current source 42, intrinsic base resistance $r_B$, base-emitter resistance $r_P$, base-emitter capacitance $C_P$, and base-collector capacitance $C_C$. Current source 42 provides a current $i_C$ equal to $g_M v_B$, where $g_M$ is the small-signal transconductance of transistor $Q_{BP}$, and $v_B$ is the voltage across elements $r_p$ and $C_p$. Resistor $R_A$ represents the composite resistance of resistors $R_1$-$R_3$ and transistor $Q_A$. To a first approximation, resistor $R_A$ is equal in value to resistor $R_3$. Resistor $R_C$ represents the resistance of any diodes (such as diode $D_C$) in the $Q_{BP}$ collector. In order to calculate the AC impedance $Z_{HL}$ that is presented to supply lines $16_H$ and $16_L$, the small-signal equivalent circuitry is driven from voltage source 44 that provides voltage $v_D$ at current $i_D$.

Analysis of the small-signal equivalent shows that it behaves approximately like the simple circuit illustrated in FIG. 8 in which capacitance $C_{EQ}$, resistance $R_{EQ}$, and inductance $L_{EQ}$ are connected in series between internal supply lines $16_H$ and $16_L$. Let $R_{AP}$ equal $R_A r_P/(R_A + r_P)$, and $C_M$ equal $C_C(1 + g_M R_C)$. The values for elements $C_{EQ}$, $R_{EQ}$, and $L_{EQ}$ are then approximately given as:

$$C_{EQ} = (C_S + C_C)R_{AP} g_M \quad (1)$$

$$R_{EQ} = (C_S + C_P + C_M)/(C_S + C_C)g_M \quad (2)$$

$$L_{EQ} = (C_P + C_M)r_B/g_M \quad (3)$$

Turning to FIG. 9 we see how the impedance $Z_{HL}$ presented to lines $16_H$ and $16_L$ varies as a function of frequency f for reasonable values of the parameters of the IC in FIG. 4 as implemented with the preferred embodiment of bypass 36 in FIG. 6. The impedance for bypass 36 by itself has the approximate frequency characteristics represented by straight-line capacitive portion 46, straight-line resistive portion 48, and straight-line [r inductive portion 50. Frequencies $f_1$ and $f_2$ that define the approximate ends of resistive portion 48 are given approximately as:

$$f_1 = \tfrac{1}{2}(C_P + C_S + C_M)R_{AP} \quad (4)$$

$$f_2 = \tfrac{1}{2}(C_P + C_M)r_B \quad (5)$$

If bypass 36 were not present in the IC (i.e., if it were arranged as shown in FIG. 2), $Z_{HL}$ would have the frequency characteristics represented approximately by inductive straight-line portion 52 and capacitive straight-line portion 54 in FIG. 9. Inductance $L_{TT}$ is the sum of inductances $L_{HE}$, $L_{HP}$, $L_{LP}$, and $L_{LE}$. Capacitance $C_{TT}$ represents the total capacitance between lines $16_H$ and $16_L$. Resonance would occur at the frequency where line 52 meets line 54.

Use of bypass 36 enables $Z_{HL}$ to have the approximate frequency characteristics shown by the heavy line that is achieved by imposing line portions 46–50 on line portions 52–54. The HF peak in $Z_{HL}$ is significantly reduced. Since line portion 52 crosses line portion 48 at intermediate frequency $f_{ITM}$, $Z_{HL}$ is resistive between $f_{ITM}$ and $f_2$. Due to the reduced $Z_{HL}$ peak and the resistive $Z_{HL}$ nature, the fluctuations that inductances $L_{HE}$, $L_{HP}$, $L_{LP}$, and $L_{LE}$ produce in internal supply voltages $V_{HHD}$ and $V_{LLD}$ as a consequence of HF currents injected into supply lines $16_H$ and $16_L$ are very small. That is, supply line ringing is much less than in the prior art ICs described above.

The HF peak in $Z_{HL}$ is also shifted toward high frequency. The reduction/shift in the $Z_{HL}$ peak in combination with the resistive $Z_{HL}$ character greatly decrease the likelihood of circuit resonance due to supply line inductive/capacitive interaction. Circuit oscillations resulting from inductive/capacitive supply line impedance are far less likely to occur than in the prior art.

In a typical implementation of the preferred embodiment of FIG. 6, $C_S$ is 2–5 picofarads. $R_1$, $R_2$, and $R_3$ are 10,000, 10,000, and 2,000 ohms, respectively. $I_S$ is 50 microamperes. Transistor $Q_{BP}$ has an effective amplification (beta) of 50, so that the $Q_{BP}$ collector current is about 2.5 milliamperes. Transistor $Q_A$ is about 1/5 the size of transistor $Q_{BP}$. Since transistors $Q_A$ and $Q_{BP}$ form a current mirror, the $Q_A$ collector current is 0.5 milliamperes.

In the small-signal equivalent of FIG. 7, $C_P$ and $C_C$ are typically 2 and 0.1 picofarads, respectively, for the preferred embodiment. $r_B$ and $r_P$ are typically 80 and 500 ohms, respectively. $R_A$ is about 2,000 ohms since $R_3$ is 2,000 ohms. $g_m$ is typically 100 milliamperes/volt.

Using the preceding values, $C_{EQ}$ in FIG. 8 is approximately 250 picofarads. $R_{EQ}$ is approximately 13 ohms. $L_{EQ}$ is approximately 1.6 nanohenries. $f_1$ and $f_2$ are approximately 50 megahertz and 1 gigahertz, respectively.

The present IC is manufactured according to conventional semiconductor fabrication techniques. No special processing is needed to creates bypass 36. The various elements that constitute bypass 36 occupy the normal amount of chip area taken up by standard circuitry elements of these types. If, for example, there are at least 100 circuitry elements 28, bypass 36 takes up a very small portion of the total chip area.

While the invention has been described with reference to particular embodiments, this description is solely for the purpose of illustration and is not to be construed as limiting the scope of the claims given below. For example, an element across which a substantially constant voltage exists could be inserted between node N1 and electrode CE since the combination of this element and capacitor $C_S$ still produces a capacitive action between line $16_H$ and electrode CE. If transistor $Q_{BP}$ is a bipolar device as in FIG. 5, the so-inserted element might be a diode or the base-emitter junction of an NPN transistor. In the FET case, the inserted element might be the gate-source portion of a like-polarity FET.

Semiconductor elements of opposite polarity to those described above could be used to accomplish the same results. In this case, the voltage polarities would also have to be reversed. Although the active bypass has been provided in a packaged IC, the active bypass could be employed in an unpackaged IC placed in a hybrid circuit. Various modifications and applications may thus be made by those skilled in the art without departing from the true scope and spirit of the invention as defined in the appended claims.

I claim:

1. An integrated circuit which comprises a group of electronic circuitry elements formed in a semiconductor die comprising a semiconductive body and an adjoining electrical interconnection system that includes first and second internal power supply lines for transmitting first and second supply voltages to provide power for the circuitry elements, the die including bypass means for inhibiting variations in the supply voltages, characterized in that the bypass means comprises:

a bypass transistor having a first flow electrode coupled to the first supply line, a second flow electrode coupled to the second supply line, and a control electrode for controlling current flow between the flow electrodes, the conductivity of the transistor substantially depending on the voltage difference between the control electrode and the first electrode;

activation means for providing the control electrode with a control signal to activate the transistor so as to maintain it in a conductive condition substantially whenever the circuitry elements are powered; and a sensing capacitor that provides a capacitive action between the second supply line and the control electrode.

2. An integrated circuit as in claim 1 characterized in that the transistor is a bipolar transistor having an emitter, a collector, and a base which are respectively the first, second, and control electrodes.

3. An integrated circuit as in claim 2 characterized in that the activation means comprises a current source coupled between the base and the second supply line.

4. An integrated circuit as in claim 3 characterized in that the capacitor is connected directly between the base and the second supply line.

5. An integrated circuit as in claim 4 characterized in that the bypass means includes a diode coupled between the collector and the second supply line.

6. An integrated circuit as in claim 3 characterized in that the current source comprises:

a like-polarity further bipolar transistor having an emitter coupled to the first supply line, a collector coupled to the base of the bypass transistor, and a base coupled to the collector of the further transistor; and a first resistor coupled between the second supply line and the collector of the further transistor.

7. An integrated circuit as in claim 6 characterized in that the current source includes:

a second resistor coupled between the base and collector of the further transistor; and a third resistor coupled between the collector of the further transistor and the base of the bypass transistor.

8. An integrated circuit as in claim 1 further including (a) an electrically insulating package that substantially surrounds the die and (b) a set of externally protruding electrical conductors that extend through the package to the interconnection system, a pair of the conductors being respectively joined to the supply lines, characterized in that the transistor is a bipolar transistor having an emitter, a collector, and a base which are respectively the first, second, and control electrodes.

9. An integrated circuit as in claim 8 characterized in that the activation means comprises a current source coupled between the base and the second supply line.

10. An integrated circuit as in claim 9 characterized in that the capacitor is coupled between the base and the second supply line.

11. An integrated circuit as in claim 9 wherein the conductor joined to the first supply line is maintained substantially at ground reference during circuit operation.

12. An integrated circuit as in claim 1 characterized in that charge carriers that move between the flow electrodes substantially originate at the first electrode and terminate at the second electrode.

13. An integrated circuit as in claim 12 characterized in that the capacitor is coupled between the control electrode and the second supply line.

14. An integrated circuit as in claim 13 characterized in that the transistor is a bipolar transistor having an emitter, a collector, and a base which are respectively the first, second, and control electrodes.

15. An integrated circuit as in claim 1 characterized in that the first electrode is connected directly to the first supply line.

16. An integrated circuit as in claim 15 characterized in that the capacitor is connected directly between the control electrode and the second supply line.

17. An integrated circuit as in claim 15 further including (a) an electrically insulating package that substantially surrounds the die and (b) a set of externally protruding electrical conductors that extend through the package to the interconnection system, a pair of the conductors being respectively joined to the supply lines, characterized in that the transistor is a bipolar transistor having an emitter, a collector, and a base which are respectively the first, second, and control electrodes.

18. An integrated circuit as in claim 17 characterized in that the activation means comprises a current source coupled between the base and the second supply line.

* * * * *

REEXAMINATION CERTIFICATE (1881st)

United States Patent [19]

Meyer

[11] B1 5,049,764

[45] Certificate Issued  Dec. 15, 1992

[54] ACTIVE BYPASS FOR INHIBITING HIGH-FREQUENCY SUPPLY VOLTAGE VARIATIONS IN INTEGRATED CIRCUITS

[75] Inventor: Robert G. Meyer, Berkeley, Calif.

[73] Assignee: North American Philips Corporation, Signetics Div., Sunnyvale, Calif.

Reexamination Request:
No. 90/002,596, Feb. 14, 1992

Reexamination Certificate for:
Patent No.: 5,049,764
Issued: Sep. 17, 1991
Appl. No.: 469,903
Filed: Jan. 25, 1990

[51] Int. Cl.[5] ............ H03K 17/16; H03K 17/60;
H03K 19/003; H03K 17/14
[52] U.S. Cl. .................. 307/443; 307/542;
307/520; 307/491; 307/263; 361/56; 361/91;
361/111

[58] Field of Search ............ 307/303, 443, 491, 542,
307/547, 549, 520, 263, 296.6, 550, 564, 567;
361/56, 58, 91, 111; 365/8; 323/311

[56] References Cited

U.S. PATENT DOCUMENTS

| | | | |
|---|---|---|---|
| 4,398,106 | 8/1983 | Davidson et al. | 307/549 |
| 4,894,567 | 1/1990 | Lenk | 307/542 |
| 4,982,120 | 1/1991 | Longwell, et al. | 307/472 |

Primary Examiner—D. R. Hudspeth

[57] ABSTRACT

An integrated circuit (10,22) contains an active bypass (36) that inhibits high-frequency supply-voltage variations caused by interaction of the circuitry elements (28) with the parasitic inductances ($L_{HE}$, $L_{HP}$, $L_{LP}$, and $L_{LE}$) associated with the power supply lines ($16_H/24_H/26_H/32_H$ and $16_L/24_L/26_L32_L$) for the circuit. The bypass centers around a transistor ($Q_{BP}$) coupled between the supply lines. An activation circuit (38) provides the transistor with a control signal ($V_C$) to activate the transistor. A sensing capacitor ($C_S$) provides a capacitive action between the transistor control electrode and one of the supply lines.

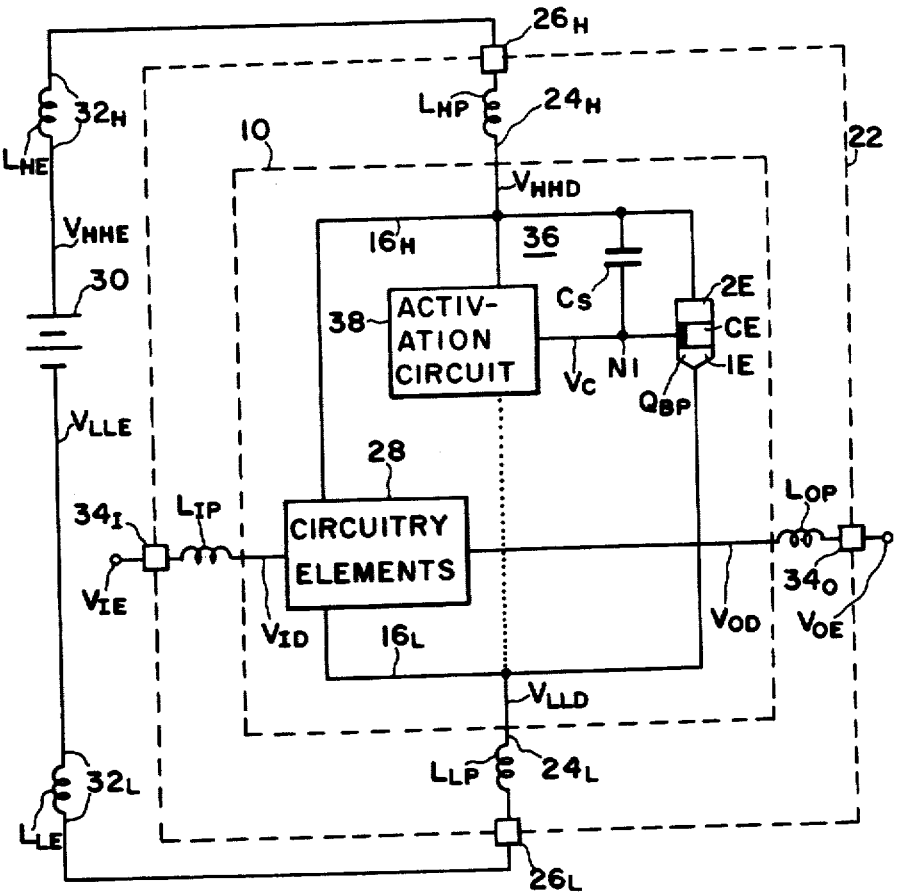

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-18 is confirmed.

* * * * *